US012701655B2

(12) United States Patent
Sekiguchi et al.

(10) Patent No.: US 12,701,655 B2
(45) Date of Patent: Aug. 4, 2026

(54) STRUCTURE BODY AND WIRING BOARD

(71) Applicant: TAIYO HOLDINGS CO., LTD., Hiki-gun (JP)

(72) Inventors: Shoya Sekiguchi, Hiki-gun (JP); Shoko Mishima, Hiki-gun (JP); Yuya Fukata, Hiki-gun (JP); Nobuhiro Ishikawa, Hiki-gun (JP)

(73) Assignee: TAIYO HOLDINGS CO., LTD., Hiki-gun (JP)

(*) Notice: Subject to any disclaimer, the term of this patent is extended or adjusted under 35 U.S.C. 154(b) by 0 days.

(21) Appl. No.: 18/878,253

(22) PCT Filed: Jun. 30, 2023

(86) PCT No.: PCT/JP2023/024512
§ 371 (c)(1),
(2) Date: Dec. 23, 2024

(87) PCT Pub. No.: WO2024/005208
PCT Pub. Date: Jan. 4, 2024

(65) Prior Publication Data

US 2026/0006718 A1 Jan. 1, 2026

(30) Foreign Application Priority Data

Jun. 30, 2022 (JP) ................................ 2022-106556

(51) Int. Cl.
*B32B 3/10* (2006.01)
*B32B 3/18* (2006.01)
*H05K 1/03* (2006.01)

(52) U.S. Cl.
CPC ............ *H05K 1/0373* (2013.01); *B32B 3/10* (2013.01); *B32B 3/18* (2013.01); *H05K 2201/0104* (2013.01); *H05K 2201/0206* (2013.01)

(58) Field of Classification Search
CPC .... B32B 3/10; B32B 3/18; B32B 3/22; B32B 27/20; B32B 2307/302; B32B 2307/304; H05K 1/0373
See application file for complete search history.

(56) References Cited

U.S. PATENT DOCUMENTS

| | | | |
|---|---|---|---|
| 6,586,526 | B1 | 7/2003 | Sekimoto et al. |
| 2001/0000518 | A1 | 4/2001 | Sekimoto et al. |
| 2022/0046795 | A1 | 2/2022 | Ikeda |

(Continued)

FOREIGN PATENT DOCUMENTS

| | | | |
|---|---|---|---|
| CN | 116230679 | A | 6/2023 |
| JP | 7-304931 | A | 11/1995 |
| JP | 7-304933 | A | 11/1995 |

(Continued)

OTHER PUBLICATIONS

International Search Report issued Sep. 26, 2023 in PCT/JP2023/024512 filed on Jun. 30, 2023, 2 pages.

*Primary Examiner* — Elizabeth E Mulvaney
(74) *Attorney, Agent, or Firm* — Oblon, McClelland, Maier & Neustadt, L.L.P.

(57) ABSTRACT

A structure body, including: an insulator, and a conductor layer provided on a surface of at least a portion of the insulator, where: the insulator includes a resin and a filler, and at least one conductor layer component of the conductor layer is present between at least one of the filler and the resin from an interface between the insulator and the conductor layer, and is connected to the conductor layer.

20 Claims, 3 Drawing Sheets

30

(56) References Cited

U.S. PATENT DOCUMENTS

| | | | |
|---|---|---|---|
| 2023/0180385 | A1 | 6/2023 | Fukui et al. |

FOREIGN PATENT DOCUMENTS

| | | | |
|---|---|---|---|
| JP | 11-87927 | A | 3/1999 |
| JP | 2014-123664 | A | 7/2014 |
| JP | 2022-30289 | A | 2/2022 |
| JP | 2023-84016 | A | 6/2023 |
| TW | 345591 | | 11/1998 |
| TW | 202335552 | A | 9/2023 |

STRUCTURE BODY AND WIRING BOARD

CROSS-REFERENCE TO RELATED APPLICATIONS

The present application is a 35 U.S.C. § 371 national stage application of International patent application PCT/JP2023/024512, filed Jun. 30, 2023, which is based on and claims the priority to Japanese Application No. 2022-106556, filed Jun. 30, 2022. The entire contents of these applications are incorporated herein by reference.

TECHNICAL FIELD

The present invention relates to a structure body and a wiring board.

BACKGROUND ART

In electronic devices, wiring boards are frequently used. As a method of manufacturing such a wiring board, for example, known is a build-up type multilayering technique in which a prepreg and a copper foil are pressed, and an insulating layer and a conductor layer are alternately stacked on an inner layer circuit board (so-called a copper-clad laminate) on which a circuit is formed. Patent Literature 1 and Patent Literature 2 propose a method in which an epoxy resin composition is applied to an inner layer circuit board on which a circuit is formed, the epoxy resin composition is heated and cured to form an insulating layer, the surface of the insulating layer is subjected to a roughening treatment in an unevenness shape with a roughening agent, and then a conductor layer (a circuit) is formed by electroless plating and electrolytic plating.

Further, Patent Literature 3 proposes a method of producing a multilayer printed wiring board in which an adhesive sheet made of an epoxy resin composition is laminated on an inner layer circuit board on which a circuit is formed, the epoxy resin composition is heated and cured to form an insulating layer, the surface of the insulating layer is subjected to a roughening treatment in an unevenness shape with a roughening agent, and then a conductor layer is formed by electroless plating and electrolytic plating.

All of the techniques described above improve adhesiveness between a conductor layer and an insulator by roughening the surface of the insulator.

CITATION LIST

Patent Literature

Patent Literature 1: JP H7-304931 A

Patent Literature 2: JP H7-304933 A

Patent Literature 3: JP H11-87927 A

SUMMARY OF INVENTION

Technical Problem

In pattern formation (patterning) of a conductor circuit in a build-up method, an unnecessary conductor layer is removed by an etching liquid. At this time, in the above-described technique, since unevenness (surface roughness) of the surface of the insulating layer is large, there arises a problem that the conductor circuit is peeled off as the etching liquid erodes a bottom portion of the conductor circuit from a recessed portion. Furthermore, in recent high-definition pattern formation of the conductor circuit, since a contact area between the conductor circuit and the insulating layer is small, such a problem tends to be remarkable. In addition, recently, reduction of transmission loss has also been studied with an increase in frequency of electrical signals. Since the transmission loss increases in proportion to the contact area between the conductor circuit and the insulating layer, it is also required to reduce surface roughness of the surface of the insulating layer from such a viewpoint.

Furthermore, with an increase in the number of layers and a reduction in weight and thickness of a multilayer printed wiring board, studies on thinning of an insulating layer have also progressed. The insulating layer secures a constant thickness thereof in order to secure electric insulation in the thickness direction, but when surface roughness of the insulating layer is large, there is also a problem in that the thickness of the layer increases by the height of unevenness of the surface.

As described above, in order to obtain a wiring board that is thinner, has higher definition, and has higher functionality, it is required to provide a technique for achieving excellent adhesiveness with a conductor circuit while reducing surface roughness of an insulating layer.

Therefore, an object of the present invention is to provide a structure body excellent in adhesiveness between an insulator and a conductor layer while reducing surface roughness of the surface of the insulator.

Solution to Problem

The present inventors have found that the above-described problem can be solved by forming an insulator and a conductor layer formed on the surface of the insulator into a specific structure that cannot be evoked by a conventional wiring board, and have completed the present invention.

That is, according to the first aspect of the present invention, provided is a structure body including:

- an insulator; and
- a conductor layer provided on a surface of at least a part of the insulator, wherein:
- the insulator includes a resin and a filler, and
- a conductor layer component identical to at least one component constituting the conductor layer enters between some of the fillers and the resin from an interface between the insulator and the conductor layer, and is connected to the conductor layer.

In the first aspect, a thin film covering the plurality of fillers may be formed by the conductor layer component entering between the filler and the resin.

In the first aspect, the filler may have an average particle diameter of 1.0 μm or less.

In the first aspect, a depth of the conductor layer component entering between the filler and the resin from the interface may be 1.5 times or more and 22 times or less the average particle diameter of the filler.

In the first aspect, the filler may be a metal oxide.

In the first aspect, the component may be a metal component.

A second aspect of the present invention is a wiring board. The wiring board has the structure body according to the first aspect.

Advantageous Effects of Invention

According to the present invention, it is possible to provide a structure body excellent in adhesiveness between an insulator and a conductor layer while reducing surface roughness of the surface of the insulator.

DESCRIPTION OF EMBODIMENTS

Figure 1:
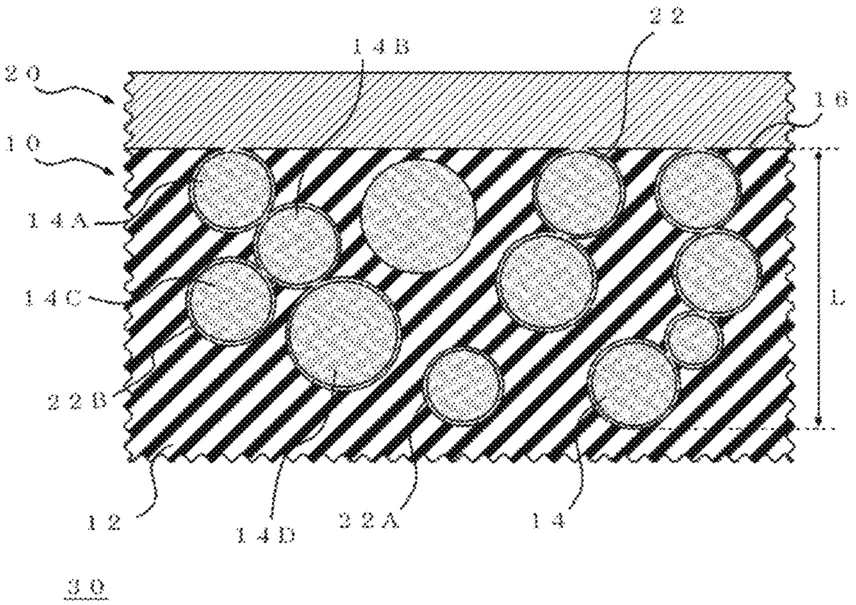
FIG. 1 is a schematic cross-sectional view schematically illustrating an embodiment of a structure body according to the present embodiment.

Hereinafter, the present invention will be described in detail.

In the present invention, related application WO 2020/017570 is incorporated by reference as appropriate.

In the present invention, a "surface" represents a boundary surface between an insulator and a gas phase, but does not include a boundary surface in a gap formed by gap formation treatment to be described later. Further, in the present invention, an "interface" represents a boundary surface between an insulator and a conductor layer, and a gap portion into which a conductor layer component enters is defined as an interpolated surface.

Hereinafter, when a plurality of upper limit values and a plurality of lower limit values are described separately, all numerical ranges that can be set by freely combining these upper limit values and lower limit values are described.

Hereinafter, in the present specification, notation "a to b" in the description of the numerical range represents a or more and b or less unless otherwise specified.

Hereinafter, unless otherwise specified, it is assumed that various measurements are performed with the environmental temperature set to room temperature (for example, 25° C.).

Hereinafter, unless otherwise specified, a content, a blending amount, and the like of each component indicate an amount based on a component (also referred to as a non-volatile component and a solid content) excluding a volatile component.

Hereinafter, when a certain compound is described, an isomer thereof is also described at the same time.

Hereinafter, "(meth)acryl" means to include both "acryl" and "methacryl". In addition, "(meth)acrylate" means to include both "acrylate" and "methacrylate".

In the present invention, phenols which are used as a raw material of a polyphenylene ether resin (PPE) and can be a constituent unit of the polyphenylene ether resin are collectively referred to as "raw material phenols".

Hereinafter, a structure body according to the present embodiment will be described, and then a method of manufacturing the structure body according to the present embodiment and a method of using the structure body according to the present embodiment will be described in this order.

<<<Structure Body>>>

A structure body according to the present embodiment will be described in detail with reference to the drawings. In the drawings referred to below, components having substantially the same functions will be denoted by the same reference numerals, and the description thereof may be omitted. It is noted that dimensional ratios in the drawings cited in the following embodiments are exaggerated for convenience of description, and may be different from actual ratios. Further, in the drawings cited in the following embodiments, configurations are simplified or schematically illustrated, or some components are omitted for convenience of description.

FIG. 1 is a schematic cross-sectional view schematically illustrating an embodiment of a structure body according to the present embodiment. A structure body 30 according to the present embodiment includes an insulator 10 and a conductor layer 20. Further, the conductor layer 20 is provided on at least a part of the surface of the insulator 10 (in FIG. 1, a boundary surface between the insulator 10 and a conductor layer on which the conductor layer 20 is provided is an interface 16). It is noted that FIG. 1 is a partially enlarged cross-sectional view of the structure body 30 in the vicinity of the interface 16 between the insulator 10 and the conductor layer 20.

«Insulator»

The insulator 10 according to the present embodiment includes a resin 12 and a filler 14. In addition, in the present embodiment, there is a region in which a conductor layer component is interposed between the resin 12 and some of the fillers 14 and the resin 12 and the fillers 14 are not in contact with each other in the depth direction from a part of the interface of the insulator 10 where at least the conductor layer is formed. The insulator 10 is typically a cured product made of a curable composition containing various components to be described in detail below.

A surface 17 of the insulator 10 according to the present embodiment before the conductor layer is provided (a boundary surface with the conductor layer 20 after the conductor layer 20 is provided is referred to as the interface 16; refer to FIGS. 2A to 2D) has resistance to a gap formation treatment (so-called roughening treatment) to be described later, and a change in surface roughness Ra before and after the gap formation treatment is suppressed to an increase of 0 to 100 nm. For example, on a smooth surface having the surface roughness Ra of 40 nm before the gap formation treatment, the surface roughness Ra after the gap formation treatment becomes 140 nm or less. As described above, in the present embodiment, adhesiveness between the insulator 10 and the conductor layer 20 can be sufficiently obtained without changing the surface roughness Ra of the surface 17, and thus, the present embodiment is suitable as an electronic member in which high-definition pattern formation of a conductor circuit and high-frequency electric transmission (for example, 5G communication or the like) are required.

It is noted that, in the present specification, the "surface roughness Ra" refers to an arithmetic average surface roughness Ra, and can be measured with a white interference microscope (manufactured by Bruker Contour GT-I, measurement range 0.17 mm×0.13 mm) or the like. In addition, the measurement surface of the surface roughness Ra after the gap formation treatment of the insulator 10 in the present specification may be the surface 17 before the conductor layer 20 is laminated or may be the surface 17 after the conductor layer 20 is removed (however, the present invention is limited to a case in which at least the conductor layer 20 is removed under a relatively mild condition of dissolving (for example, a ferric chloride solution, a cupric chloride solution, and a hydrogen peroxide-sulfuric acid etching liquid)). The surface roughness Ra after the gap formation treatment of the insulator is preferably 140 nm or less, and more preferably 100 nm or less. A lower limit value of the surface roughness Ra after the gap formation treatment of the insulator is not particularly limited, and is 0.1 nm, 0.5 nm, 1 nm, 5 nm, or the like.

«Conductor Layer»

The conductor layer 20 according to the present embodiment is formed of a conductor (metal). The type of the conductor can be appropriately determined according to the type of the insulator 10, conductivity, durability, and the like, and is typically copper or silver. In FIG. 1, the conductor layer 20 is a single component, but may contain two or more kinds of components, or may be a laminate of two or more kinds of conductors, or the like.

In the present embodiment, a conductor layer component identical to at least one component constituting the conductor layer 20 enters between at least some of the fillers 14 and the resin 12, and is connected to the conductor layer 20. In other words, at least some of the components of the conductor layer 20 are interposed in a gap between at least some of the fillers 14 and the resin 12 to form a thin film 22 continuous with the conductor layer 20. As described above, since thin film 22 has the same conductor layer component as at least one component of the conductor layer 20 that is a conductor, it can be said that thin film 22 is formed of a conductor layer component containing the same conductor component (that is, a metal component) as the conductor layer 20. The thickness of the thin film 22 according to the present embodiment is not particularly limited, but is, for example, 100 nm or less. As described above, in the structure body 30 according to the present embodiment, the conductor layer component same as at least one component constituting the conductor layer 20 forms a fine anchor in the depth direction from the interface 16 between the insulator 10 and the conductor layer 20, and thus, adhesiveness between the insulator 10 and the conductor layer 20 is excellent.

It is noted that, since FIG. 1 is a cross-sectional view of the structure body 30 according to the present embodiment, a thin film 22A is apparently not connected to the conductor layer 20 (that is, a part of the thin film 22 is apparently not connected to the conductor layer 20). However, the thin film 22A is connected to the conductor layer 20 at a location different from the cross section illustrated in FIG. 1. Whether the conductor layer 20 is connected to the thin film 22 and whether the thin films 22 are connected to each other can be confirmed by, for example, a dual beam scanning electron microscope (FIB-equipped SEM) or the like.

In the present embodiment, the depth of the conductor layer component entering between the filler 14 and the resin 12 from the interface 16 is preferably 1.5 times or more and 22 times or less, and more preferably 2.0 times or more and 20 times or less the average particle diameter (described later) of the filler 14. In the present embodiment, when the depth of the conductor layer component entering between the filler 14 and the resin 12 from the interface 16 is in such a range, sufficient adhesiveness between the insulator 10 and the conductor layer 20 can be obtained, and both thinning of the insulator 10 and electrical insulation can be achieved.

It is noted that, in the present specification, the "depth from the interface" refers to an average value of the top 5 points of the longest depth (L in FIG. 1) of a portion (the thin film 22) where the conductor layer 20 component is present in the vertical direction from the interface 16 toward the insulator 10 (in the direction opposite to the conductive layer 20) by acquiring a plurality of cross-sectional photographs of the structure body 30 (for example, a cross-sectional SEM (scanning electron microscope) photograph of a portion where the insulator 10 and the conductor layer 20 are in contact with each other at a magnification of 5,000 to 100,000 times). Specifically, for example, the "depth from the interface" can be calculated by acquiring a cross-sectional photograph enlarged 10,000 times when the average particle diameter of the filler is 0.1 μm or more, and a cross-sectional photograph enlarged 100,000 times when the average particle diameter of the filler is less than 0.1 μm. As illustrated in FIG. 1, it is preferable that the thin film 22 covering at least a part of the filler 14 is formed by a conductor layer component entering between the filler 14 and the resin 12, and it is more preferable that a thin film 22B covering a plurality of fillers (for example, a filler 14A, a filler 14B, a filler 14C, and a filler 14D) is formed. It is noted that, in the present specification, the term "covering" refers to a case in which the thin film 22 is in contact with the entire periphery of the filler cross section in the cross-sectional photograph described above. The thin film 22 is not only interposed between the filler 14 and the resin 12, but also interposed between the fillers 14 in some cases.

<<<<Method of Manufacturing Structure Body>>>>

Hereinafter, a method of manufacturing the structure body according to the present embodiment will be described in detail. First, raw materials used for manufacturing the structure body according to the present embodiment will be described, and then a method of manufacturing the structure body according to the present embodiment will be described.

<<<Insulator>>

The insulator 10 according to the present embodiment is typically a cured product obtained by curing a curable composition containing various components described in detail below. The curable composition can be manufactured according to a known method, and is obtained, for example, by blending, stirring, and dispersing each component with a thermosetting resin, a photocurable resin, or the like as a main component. Hereinafter, a resin component, a filler, and other components which are components of the curable composition according to the present embodiment will be described in detail.

«Resin Component»

The resin component according to the present embodiment is not particularly limited, but is preferably a hydrophobic resin in order to impart resistance to a gap formation treatment as a cured product. By enhancing hydrophobicity of the resin as a resin component, the insulator 10 easily has sufficient resistance to the gap formation treatment, and permeation of a gap formation treatment liquid is easily suppressed, thereby easily suppressing roughening on the surface of the insulator 10 during the gap formation treatment. On the other hand, since an interface between the resin and the filler has relatively low resistance to the gap formation treatment and also has relatively high hydrophilicity, the gap formation treatment liquid easily permeates the interface between the resin and the filler, and the roughening (porositization) easily proceeds selectively at the interface between the resin and the filler. Therefore, when hydrophobicity of the resin is increased (for example, when a hydrophobic resin is used), it is presumed that a gap particularly suitable for thin film formation of the present embodiment can be formed. As the resin component according to the present embodiment, for example, polyester resins such as polyethylene terephthalate (PET) and polyethylene naphthalate (PEN), polyamide resins, polyamideimide resins, polyphenylene sulfide resins, polyether ether ketone resins, polyether sulfone resins, polycarbonate resins, polyether imide resins, epoxy resins, phenol resins, phenoxy resins, glass-epoxy resins, polyphenylene ether resins (PPE), acrylic resins, silicone resins, polyolefin resins such as polyethylene and polypropylene, polycycloolefin resins such as polynorbornene, triazine-based resins such as melamine, and the like can be used. These resin components can be used alone or in combination of two or more kinds thereof. It is noted that, in the present specification, the "resin component" does not include an elastomer to be described later.

Examples of the preferable resin component according to the present embodiment include a polyphenylene ether resin and an epoxy resin. In the polyphenylene ether resin according to the present embodiment, a main chain structure may have a linear structure (linear polyphenylene ether resin) or a branching type structure (branching type polyphenylene ether resin). When the polyphenylene ether resin is subjected to a curing reaction with other components, the polyphenylene ether resin preferably has a functional group containing an unsaturated carbon bond, such as a vinyl group or an allyl group, which does not impair dielectric properties (also referred to as "unsaturated carbon bond-containing"), more preferably has a hydrocarbon group containing an unsaturated carbon bond, and particularly preferably has an unsaturated carbon-bond-containing branching type polyphenylene ether resin, more particularly preferably has a branching type polyphenylene ether resin having a hydrocarbon group containing an unsaturated carbon bond. The epoxy resin according to the present embodiment is not particularly limited, and a known conventional epoxy resin can be used.

The polyphenylene ether resin having a branching structure (also referred to as a "branching type polyphenylene ether resin") is a polyphenylene ether resin produced from raw material phenols containing phenols having hydrogen atoms at the ortho position and the para position. Since such phenols have a hydrogen atom at the ortho position, when the phenols are oxidatively polymerized, an ether bond can be formed not only at the ipso position and the para position but also at the ortho position, so that the polyphenylene ether resin obtained using such phenols as raw material phenols can form a branching chain structure. Such a branching type polyphenylene ether resin is excellent in solubility in a solvent, compatibility with each component in the composition, and reactivity.

Examples of the unsaturated carbon bond-containing polyphenylene ether resin having a branching structure include the polyphenylene ether resin disclosed in WO 2020/017570 A.

The unsaturated carbon bond-containing polyphenylene ether resin having a branching structure may be obtained by any method of (Method 1) a method of synthesizing a polyphenylene ether resin using a phenol containing a functional group having an unsaturated carbon bond as a raw material phenol, or (Method 2) a method of synthesizing a polyphenylene ether resin using a phenol not containing a functional group having an unsaturated carbon bond as a raw material phenol, modifying the obtained polyphenylene ether resin, and introducing a functional group having an unsaturated carbon bond into the polyphenylene ether resin.

The unsaturated carbon bond-containing polyphenylene ether resin having a branching structure may be a mixture of two or more kinds of polyphenylene ether resins having different kinds of raw material phenols.

As other raw material phenols, for example, phenols represented by the following chemical formula (1) may be used.

[Chemical Formula 1]

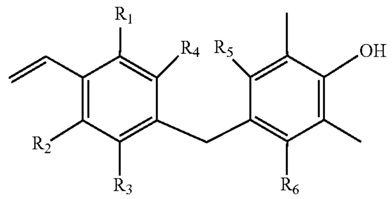

(1)

In the chemical formula (1), $R_1$ to $R_6$ each independently represent hydrogen or a hydrocarbon group having 1 to 10 carbon atoms.

Examples of the hydrocarbon group include an alkyl group, an alkenyl group, an alkynyl group, an aryl group, and a cycloalkyl group. When $R_1$ to $R_6$ are hydrocarbon groups, they are preferably alkyl groups.

A phenol compound represented by the chemical formula (1) can be synthesized according to the following reaction formulas (A) to (C).

[Chemical Formula 2]

(A)

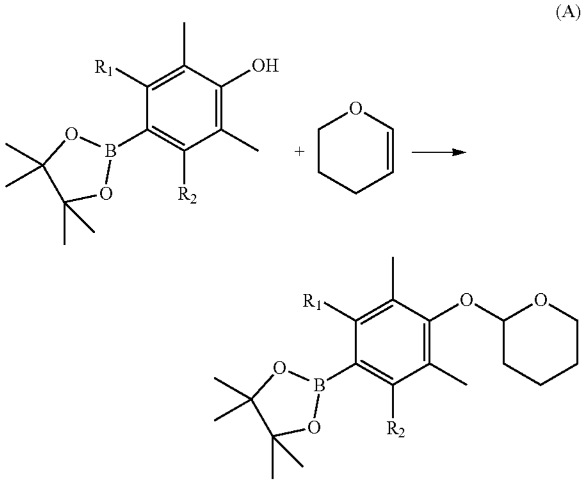

(4)

(B)

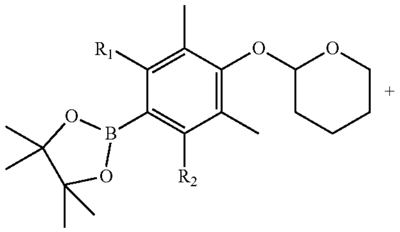

(4)

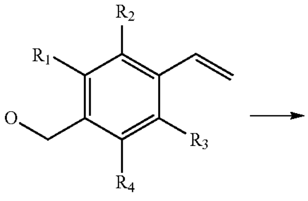

-continued

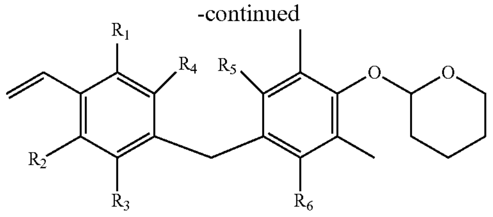

(5)

(C)

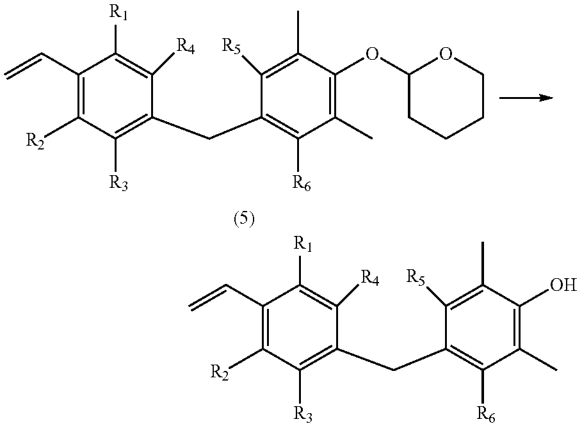

(5)

(1)

$R_1$ to $R_6$ represented by the reaction formulas (A) to (C) are each independently hydrogen or a hydrocarbon group having 1 to 10 carbon atoms. Examples of the hydrocarbon group include a straight-chain or branching alkyl group.

The reaction represented by the reaction formula (A) is an addition reaction of a phenolic hydroxyl group of a raw material to a double bond of 3,4-dihydro-2H-pyran, more specifically, a tetrahydropyran protection reaction of a hydroxyl group. As the reaction conditions, conditions known as addition reaction for the double bond of the phenolic hydroxyl group can be appropriately selected. Specifically, an example of a reaction solvent includes dichloromethane. An example of a reaction catalyst includes pyridinium p-toluenesulfonate. The reaction represented by the reaction formula (A) can proceed at room temperature.

The reaction represented by the reaction formula (B) is a cross-coupling reaction between a compound represented by a chemical formula (4) and chloromethylstyrene. As the reaction conditions, conditions known as a cross-coupling reaction can be appropriately selected. Specifically, for example, a process can proceed under a nitrogen atmosphere at 100° C. Examples of the reaction solvent include 2,4-dioxane, methanol, ethanol, toluene, tetrahydrofuran, dimethylformamide, and water. Examples of the base include sodium hydrogen carbonate, sodium carbonate, potassium carbonate, and sodium hydroxide. As the reaction catalyst, a palladium-based catalyst can be used, and an example thereof includes palladium-tetrakis(triphenylphosphine).

The reaction represented by the reaction formula (C) is a reaction for deprotecting the phenolic hydroxyl group of the compound represented by the chemical formula (3). As reaction conditions, conditions known as a deprotection reaction of a phenolic hydroxyl group can be appropriately selected. A specific example of the reaction solvent includes methanol. An example of the reaction catalyst includes p-toluenesulfonic acid monohydrate. The reaction represented by the reaction formula (C) can proceed at room temperature.

As another raw material phenol, a phenol (X) represented by the following chemical formula (11) may be used.

[Chemical Formula 3]

(11)

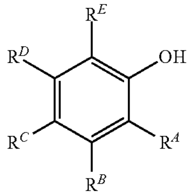

In the chemical formula (11), $R^A$, $R^C$, and $R^E$ each independently represent a functional group having 1 to 10 carbon atoms, $R^B$ and $R^D$ each independently represent hydrogen or a functional group having 1 to 10 carbon atoms, and one or more of $R^A$ to $R^E$ represent a functional group containing an unsaturated carbon bond (preferably, a functional group having three or more carbon atoms).

The phenol compound (X) may have only one or two or more functional groups containing an unsaturated carbon bond.

In the chemical formula (11), $R^A$, $R^C$, and $R^E$ are each independently preferably a hydrocarbon group having 10 or less carbon atoms, five or less carbon atoms, or three or less carbon atoms.

In the chemical formula (11), $R^B$ and $R^D$ are each independently preferably hydrogen or a hydrocarbon group having 10 or less carbon atoms, hydrogen or a hydrocarbon group having five or less carbon atoms, hydrogen or a hydrocarbon group having three or less carbon atoms, hydrogen or a hydrocarbon group having one carbon atom, or hydrogen.

Specific examples of the phenols (X) include a compound represented by the following chemical formula (12) (4-allyl-2,6-dimethylphenol) and a compound represented by the following chemical formula (13) (2-allyl-4,6-dimethylphenol). The phenols (X) can be produced using a known method such as a synthesis method described in WO2021/070714.

[Chemical Formula 4]

(12)

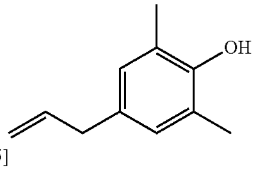

[Chemical Formula 5]

(13)

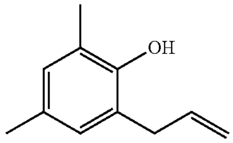

Examples of the epoxy resin include bisphenol epoxy resins (Bisphenol A epoxy resin, bisphenol F epoxy resin, and the like), novolac epoxy resins (Bisphenol A novolac epoxy resin, phenol novolac epoxy resin, cresol novolac epoxy resin, and the like), biphenyl epoxy resins, biphenyl novolac epoxy resins, and biphenyl aralkyl epoxy resins.

A curing agent for the epoxy resin is not particularly limited, and for example, an active ester-based curing agent, a phenol-based curing agent, an acid anhydride-based curing agent, an amine-based curing agent, an imidazole-based curing agent, or the like can be used. It is preferable to use the active ester-based curing agent from the viewpoint of improving resistance to the gap formation treatment by reducing a polar group in the cured product and facilitating gap formation.

«Filler»

The material of the filler 14 according to the present embodiment is not particularly limited as long as it is usually blended in the insulating layer. When the structure body 30 is manufactured by a manufacturing method to be described later, a material having acid resistance and alkali resistance is preferable. The material of the filler 14 according to the present embodiment is preferably an inorganic filler, and specific examples thereof include clay minerals such as talc, mica, sericite, and montmorillonite, metal oxides such as silica, alumina, and titanium oxide, metal hydroxides such as aluminum hydroxide and magnesium hydroxide, fillers having a perovskite-type crystal structure such as barium titanate and strontium titanate, boron nitride, aluminum borate, barium sulfate, and calcium carbonate. Among them, silica is preferable from the viewpoint of dielectric properties and thermal expansion, and alumina is preferable from the viewpoint of heat dissipation.

The average particle diameter of the filler according to the present embodiment is preferably 1.0 μm or less, more preferably 0.8 μm or less, and still more preferably 0.5 μm or less. It is noted that, in the present specification, the "average particle diameter" refers to a median diameter (D50) measured using a laser diffraction particle size analyzer. As the laser diffraction particle size analyzer, for example, Microtrac MT3300EXII manufactured by MicrotracBEL Corp. can be used. The D90 of the filler according to the present embodiment is preferably 2.0 μm or less, more preferably 1.5 μm or less, and still more preferably 1.0 μm or less. It is noted that, in the present specification, the terms "D50" and "D90" refer to particle diameters at which the cumulative volume percentages of the particles measured in the same manner as described above (the cumulative volume percentages in the volume particle size distribution when plotted from the smallest particle diameter) are 50% and 90%, respectively. When the particle diameter of the filler is in such a range, the structure body 10 having excellent adhesiveness can be acquired, and a high-definition conductor circuit pattern can be formed.

Regarding the filler 14 according to the present embodiment, the presence or absence of surface treatment is not particularly limited, but a filler subjected to surface treatment for enhancement of dispersibility and reactivity may be used. Examples of the surface treatment of the filler 14 include a surface treatment using a coupling agent and a surface treatment without introducing an organic group such as an alumina treatment. As the coupling agent according to the present embodiment, for example, known silane coupling agents such as a vinylsilane coupling agent, a phenylsilane coupling agent, a phenylaminosilane coupling agent, a (meth)acrylsilane coupling agent, a styrylsilane coupling agent, an epoxysilane coupling agent, and a mercaptosilane coupling agent can be used.

Examples of the vinylsilane coupling agent include vinylalkoxysilanes such as vinyltrimethoxysilane, vinyltriethoxysilane, vinylmethyldimethoxysilane, and vinyldimethylmethoxysilane.

Examples of the phenylsilane coupling agent include phenyltrimethoxysilane, phenyltriethoxysilane, and dimethoxydiphenylsilane.

Examples of the phenylaminosilane coupling agent include N-phenyl-3 aminopropyltrimethoxysilane.

Examples of the (meth)acrylsilane coupling agent include 3-methacryloxypropylmethyldimethoxysilane, 3-methacryloxypropyltrimethoxysilane, 3-methacryloxypropyltriethoxysilane, and 3-acryloxypropyltrimethoxysilane.

Examples of the styrylsilane coupling agent include p-styryltrimethoxysilane.

Examples of the epoxysilane agent coupling include 3-glycidoxypropyltrimethoxysilane and 3-glycidoxypropylmethyldimethoxysilane.

Examples of the mercaptosilane coupling agent include 3-mercaptopropyltriethoxysilane.

A method of treating the surface of the filler using the coupling agent is not particularly limited, and a known method can be used. Usually, a silanol group is produced by hydrolyzing the alkoxy group of the coupling agent, and the surface treatment of the filler can be performed by bringing the coupling agent into contact with the filler so as to dehydrate and condense the silanol group of the coupling agent and the hydroxyl group present on the surface of the filler. This treatment may be performed in a heating environment or a dry environment as necessary. In addition, as the filler 14 according to the present embodiment, a commercially available product sold in a state of being surface-treated with a coupling agent may be used.

The usage amount of the coupling agent can be, for example, 0.1 to 5.0 parts by mass or 0.5 to 3.0 parts by mass when the total mass of the filler is 100 parts by mass.

The filler 14 according to the present embodiment may be blended with other components in a powdery or solid state, or may be blended with other components after being mixed with a solvent or a dispersant to form a slurry, depending on the usage mode. Since dispersibility of the filler 14 is improved, it is preferable to form a slurry and then blend the slurry. It is noted that the blending amount of the filler 14 described later refers to a value in a powdery or solid state.

The blending amount of the filler 14 according to the present embodiment is preferably 5% by vol or more and 50% by vol or less, more preferably 5% by vol or more and 30% by vol or less, still more preferably 5% by vol or more and 25% by vol or less, and particularly preferably 5% by vol or more and 20% by vol or less with respect to the total nonvolatile content of the curable composition. When the blending amount of the filler 14 is in such a range, adhesiveness between the insulator 10 and the conductor layer 20 is improved. In addition, it is presumed that by setting the blending amount of the filler 14 to 50% by vol or less, preferably 30% by vol or less, a distance between the fillers 14 adjacent to each other in the insulator 10 can be appropriately maintained, that is, the amount of the resin 12 present between the adjacent gaps formed in the gap formation treatment can be appropriately maintained. Therefore, since the resin 12 around the filler 14 has sufficient strength even after the gap formation treatment, it is considered that the gap can be prevented from being broken or the filler 14 can be prevented from falling off from the insulator 10, and a gap particularly suitable for thin film formation according to the present embodiment can be easily formed.

«Other Additives»

The curable composition according to the present embodiment may contain other components as necessary in addition to the above-described components as long as the effects of the present invention are not impaired. Examples of the component that can be contained in the curable composition according to the present embodiment include peroxide, a crosslinkable curing agent, an elastomer, and a solvent.

In addition, the other components may be known components such as a sensitizer, an adhesion aid, a surfactant, a leveling agent, a plasticizer, an adhesive, a colorant, a fiber, a flame retardant, a cellulose nanofiber, a dispersant, a curing catalyst, a dispersion aid, a thickener, an antifoaming agent, an antioxidant, a rust inhibitor, and an adhesiveness imparting agent.

<Peroxide>

When the resin component has a functional group containing an unsaturated carbon bond, the curable composition according to the present embodiment preferably contains peroxide.

Examples of the peroxide include methyl ethyl ketone peroxide, methyl acetoacetate peroxide, acetylacetperoxide, 1,1-bis(t-butylperoxy)cyclohexane, 2,2-bis(t-butylperoxy) butane, t-butyl hydroperoxide, cumene hydroperoxide, diisopropylbenzene hydroperoxide, 2,5-dimethylhexane-2, 5-dihydroperoxide, 1,1,3,3-tetramethylbutyl hydroperoxide, di-t-butyl hydroperoxide, t-butyl hydroperoxide, dicumyl peroxide, 2,5-dimethyl-2,5-di(t-butylperoxy) hexane, 2,5-dimethyl-2,5-di(t-butylperoxy) hexyne, 2,5-dimethyl-2,5-di (t-butylperoxy)-3 butene, acetyl peroxide, octanoyl peroxide, lauroyl peroxide, benzoyl peroxide, m-toluyl peroxide, diisopropyl peroxydicarbonate, t-butylene peroxybenzoate, di-t-butyl peroxide, t-butylperoxyisopropyl monocarbonate, α,α'-bis(t-butylperoxy-m-isopropyl)benzene. Only one kind of peroxide may be used, or two or more kinds thereof may be used.

Among them, the peroxide having a one-minute half-life temperature of 130° C. to 180° C. is desirable from the viewpoint of ease of handling and reactivity. Since such a peroxide has a relatively high reaction starting temperature, it is difficult to accelerate curing at the time when curing is not required, such as during drying, and storability of a curable composition does not deteriorate, and since volatility is low, the peroxide does not volatilize during drying or during storage, and the peroxide has good stability.

An addition amount of the peroxide is preferably 0.01 to 20 parts by mass, more preferably 0.05 to 10 parts by mass, and particularly preferably 0.1 to 10 parts by mass with respect to 100 parts by mass of the solid content of the curable composition in terms of the total amount of the peroxide. By setting the total amount of the peroxide within this range, sufficient curability can be obtained, and a cured product excellent in mechanical properties, heat resistance, dielectric properties, and the like can be obtained.

<Crosslinkable Curing Agent>

The curable composition according to the present embodiment preferably contains a crosslinkable curing agent. The crosslinkable curing agent is not particularly limited as long as it is a compound that undergoes a curing reaction with the resin 12 and is a commonly used crosslinkable curing agent. As the crosslinkable curing agent according to the present embodiment, one having good compatibility with the resin component is preferably used.

Examples of the crosslinkable curing agent according to the present embodiment include a compound having a phenolic hydroxyl group, a polycarboxylic acid and an acid anhydride thereof, a compound having a cyanate ester group, an alicyclic olefin polymer, a polyfunctional vinyl compound, a vinyl benzyl ether-based compound, an allyl ether-based compound, trialkenyl isocyanurate, a (meth) acrylate compound, and an active ester-based compound. When the polyphenylene ether resin is used as the resin component, the crosslinkable curing agent according to the present embodiment is preferably, for example, triallyl isocyanurate (TAIC (registered trademark)) or triallyl cyanurate (hereinafter, TAC). The crosslinkable curing agents can be used alone or in combination of two or more kinds thereof.

When the polyphenylene ether resin is used as the resin component in the curable resin composition, a blending ratio of the polyphenylene ether resin and the crosslinkable curing agent (for example, trialkenyl isocyanurate) is preferably 20:80 to 90:10, and more preferably 30:70 to 90:10 as a solid content ratio (resin component:crosslinkable curing agent). Within such a range, a cured product 11 excellent in low dielectric properties and heat resistance is obtained.

When the epoxy resin is used as the resin component, the crosslinkable curing agent according to the present embodiment is preferably, for example, a compound having a phenolic hydroxyl group or an active ester-based compound. It is particularly preferable to use an active ester-based compound as the crosslinkable curing agent from the viewpoint of improving resistance to the gap formation treatment by reducing the amount of polar groups in the cured product and facilitating gap formation. As the active ester-based compound, a compound having two or more highly reactive ester groups in one molecule, such as phenol esters, thiophenol esters, N-hydroxyamine esters, and esters of heterocyclic hydroxy compounds, is preferably used. Specific examples of the active ester-based compound include an active ester compound containing a dicyclopentadiene type diphenol condensed structure, an active ester compound containing a naphthalene structure, an active ester compound containing an acetylated product of phenol novolac, and an active ester compound containing a benzoylated product of phenol novolac.

When the epoxy resin is used as the resin component in the curable resin composition, a blending ratio between the epoxy resin and the crosslinkable curing agent (for example, the active ester-based compound) is, for example, such that the epoxy group equivalent of the epoxy resin: the active ester group equivalent of the active ester-based compound is preferably 80:20 to 50:50, and more preferably 70:30 to 60:40.

<Elastomer>

The curable composition according to the present embodiment may contain an elastomer. By containing the elastomer, tensile properties of the cured product 11 are improved.

The elastomer is roughly classified into a thermosetting elastomer and a thermoplastic elastomer.

Examples of the thermosetting elastomer include diene-based synthetic rubbers such as polyisoprene rubber, polybutadiene rubber, styrene-butadiene rubber, polychloroprene rubber, nitrile rubber, and ethylene-propylene rubber; non-diene-based synthetic rubbers such as ethylene-propylene rubber, butyl rubber, acrylic rubber, polyurethane rubber, fluororubber, silicone rubber, and epichlorohydrin rubber; and natural rubber.

Examples of the thermoplastic elastomer include a styrene elastomer, an olefin elastomer, a urethane elastomer, a polyester elastomer, a polyamide elastomer, an acrylic elastomer, and a silicone elastomer.

When the polyphenylene ether resin is used as the resin component, the elastomer according to the present embodiment is preferably a styrene-butadiene copolymer such as a styrene-butadiene-styrene block copolymer: styrene-isoprene copolymer such as styrene-isoprene-styrene block copolymer: a styrene-ethylene-butylene-styrene block copolymer, a styrene-ethylene-propylene-styrene block copolymer, and the like, and a water additive of the copolymers thereof.

The weight average molecular weight of the elastomer according to the present embodiment may be 1,000 or more and 300,000 or less, or 2,000 or more and 150,000 or less. It is noted that, in the present specification, the weight average molecular weight is obtained by performing measurement by gel permeation chromatography (GPC) and performing conversion by a calibration curve prepared using standard polystyrene. When the weight average molecular weight is the lower limit value or more, excellent low thermal expansion properties are obtained, and when the weight average molecular weight is the upper limit value or less, excellent compatibility with other components is obtained.

The blending amount of the elastomer according to the present embodiment may be 50 parts by mass or more and 200 parts by mass or less when the resin component is 100 parts by mass. Alternatively, the blending amount of the elastomer may be 5% by mass or more and 30% by mass or less based on the total solid content of the curable composition. When the elastomer is in such a range, good curability, moldability, and chemical resistance can be realized in a well-balanced manner.

<Solvent>

The curable composition is usually provided or used in a state in which the resin component is dissolved in a solvent (solvent). Examples of the solvent that can be used in the curable composition according to the present embodiment include solvents having relatively high safety, such as N-methyl-2 pyrrolidone (NMP), tetrahydrofuran (THF), cyclohexanone, propylene glycol monomethyl ether acetate (PMA), diethylene glycol monoethyl ether acetate (CA), methyl ethyl ketone, and ethyl acetate, in addition to conventionally usable solvents such as chloroform, methylene chloride, and toluene. It is noted that the solvent may be N,N-dimethylformamide (DMF). The solvent may be used singly or in combination of two or more kinds thereof.

It is noted that the content of the solvent in the curable composition is not particularly limited, and can be appropriately adjusted depending on the use of the curable composition. It is noted that the cured product 11 obtained by curing the curable composition usually does not contain a solvent.

<Component that May be Unsuitable>

In order to avoid an increase in the surface roughness of the insulator surface after the gap formation treatment, it is desirable that the curable composition according to the present embodiment has poor compatibility with the curable composition and does not contain a component dissolved in a gap formation treatment liquid (an alkali treatment liquid, an oxidation treatment liquid, or the like described later). An example of the component that may be unsuitable includes a maleimide compound having a long chain aliphatic structure in the case of a curable composition containing a polyphenylene ether resin as a resin component.

<Dry Film>

The curable composition according to the present embodiment can be a dry film. Specifically, at least one surface of the resin layer formed of the curable composition according to the present embodiment is supported or protected by a film. When the dry film according to the present embodiment is a laminate including two or more resin layers, a resin layer having at least the surface on which a conductor layer is provided may be a resin layer including the curable resin composition according to the present embodiment.

A film (a base material film) serving as a support is not particularly limited, and may be a metal foil such as a copper foil, a polyimide film, a polyester film, or a film such as a polyethylene naphthalate (PEN) film. It is noted that these films can also be used as a support of a dry film or a cover film.

In a method of manufacturing a dry film, for example, a solution of the curable composition of the present embodiment is applied onto a base material film by an applicator or the like and is dried to form a resin layer. Then, a cover film is bonded to the resin layer as necessary.

Coating and drying in the case of manufacturing a dry film can be performed by known methods and conditions. For example, a known coating method such as a comma coater, a blade coater, a lip coater, a rod coater, a squeeze coater, a reverse coater, a transfer roll coater, a gravure coater, or a spray coater can be used, and heating and drying can be performed by a known heating means such as a hot air circulating drying furnace, an IR furnace, a hot plate, or a convection oven. The thickness of the resin layer can be adjusted by changing coating conditions and the solid content and viscosity of the curable composition.

«Conductor Layer»

The conductor layer 20 according to the present embodiment is formed of a conductor (metal). The type of the conductor is not particularly limited, and copper, silver, gold, tin, nickel, and the like, and a plurality of conductors can be used in combination. The type of the conductor is typically copper or silver.

<<<<Manufacturing Method>>>>

Hereinafter, an example of a method of manufacturing the structure body according to the present embodiment will be described with reference to a schematic step diagram in FIGS. 2A to 2D.

<<<Step of Preparing Cured Product 11>>>

Figure 2A:
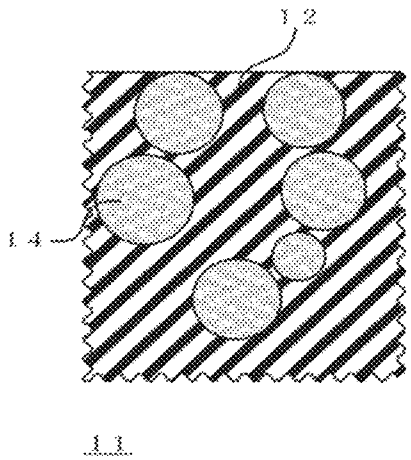
FIGS. 2A to 2D are schematic process diagrams of the structure body according to the present embodiment.

First, as illustrated in FIG. 2A, the cured product 11 obtained by curing the curable composition described above is prepared.

A method of obtaining the cured product 11 from the curable composition is not particularly limited, and can be appropriately changed depending on the composition of the curable composition. As an example, after the curable composition is applied onto a base material (for example, coating by an applicator or the like), a drying step of drying the curable composition is performed as necessary, and a thermal curing step of thermally crosslinking the resin 12 by heating (for example, heating by an inert gas oven, a hot plate, a vacuum oven, a vacuum press machine, or the like) may be performed. It is noted that the conditions for carrying out each step (for example, coating thickness, drying temperature and time, heating temperature and time, and the like) may be appropriately changed depending on the composition, use, and the like of the curable composition. It is noted that, as the base material, in addition to a printed wiring board or a flexible printed wiring board in which a circuit is formed in advance using copper or the like, a material such as paper phenol, paper epoxy, glass cloth epoxy, glass polyimide, glass cloth/nonwoven epoxy, glass cloth/paper epoxy, synthetic fiber epoxy, fluororesin/polyethylene/polyphenylene ether, or a copper-clad laminate for a high-frequency circuit using polyphenylene oxide cyanate or the like is used, and examples thereof include copper-clad laminates of all grades (FR-4 and the like), metal substrates, polyimide films, polyethylene terephthalate films, polyethylene naphthalate (PEN) films, glass substrates, ceramic substrates, and wafer plates.

<<<Step of Forming Gap 13>>>

Figure 2B:
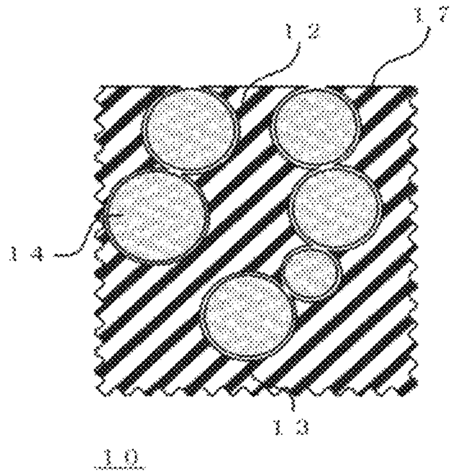

Next, as illustrated in FIG. 2B, a gap 13 is formed between the resin 12 and the filler 14 in the depth direction from the surface 17 of at least a part of the cured product 11, thereby preparing the insulator 10. Such an insulator 10 can be obtained, for example, by performing gap formation treatment on the cured product 11 described above. Since the cured product 11 according to the present embodiment has resistance to a gap formation treatment liquid, a change in surface roughness Ra before and after the gap formation treatment (front: cured product 11, back: insulator 10) is suppressed to an increase of 0 to 100 nm. For example, when the surface roughness Ra of the cured product 11 before the gap formation treatment is 40 nm, the surface roughness Ra of the insulator 10 after the gap formation treatment is 140 nm or less.

It is noted that the gap formation step can be treated by a method similar to a surface roughening (roughening) step of forming unevenness on the insulator surface to impart adhesiveness of the conductor layer or a desmear step of removing smear (residue) generated when a via is formed by laser processing or the like by a multilayering technique by a build-up method. In other words, as the gap formation treatment liquid, a roughening treatment liquid or a desmear liquid can be used.

The gap formation treatment can be performed by, for example, a method of immersing in an alkali treatment liquid including an aqueous solution of sodium hydroxide, an oxidation treatment liquid including an aqueous solution of potassium permanganate or sodium permanganate and sodium hydroxide, or an acid treatment liquid including an aqueous solution of sulfuric acid in this order. An example of the commercially available alkali treatment liquid includes a swelling dip secure ligand P (manufactured by Atotech Japan Co., Ltd.), an example of the oxidation treatment liquid includes a concentrate compact CP (manufactured by Atotech Japan Co., Ltd.), and an example of the acid treatment liquid includes a reduction secure ligand P500 (manufactured by Atotech Japan Co., Ltd.). In the gap formation treatment, it is considered that the resin 12 on the surface 17 of the cured product 11 is slightly dissolved in either the alkali treatment liquid or the oxidation treatment liquid, and further permeates between the filler 14 and the resin 12, thereby forming the gap 13. As conditions for the gap formation treatment, for example, the alkali treatment liquid is performed at 50 to 70° C. for 0 to 10 minutes, the oxidation treatment liquid is performed at 70 to 90° C. for 5 to 20 minutes, and the acid treatment liquid is performed at 30 to 50° C. for 5 minutes. By controlling these conditions, a depth (that is, a depth at which the gap 13 is formed) into which the treatment liquid enters can be adjusted.

<<<Step of Forming Conductor Layer 20>>>

Figure 2C:
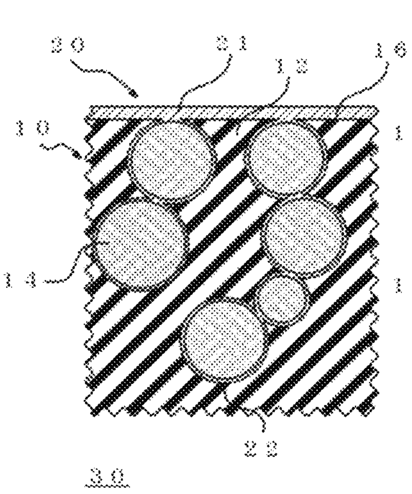
Figure 2D:
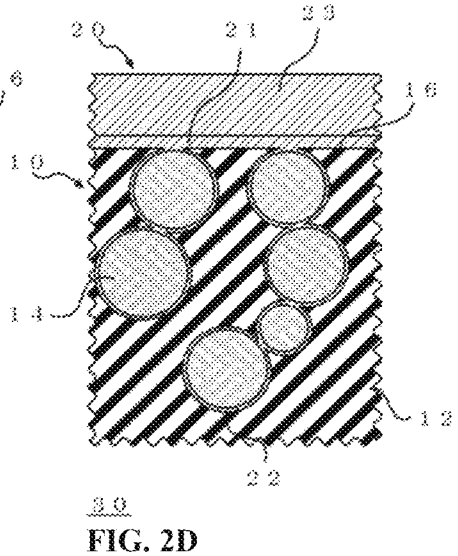

Finally, as illustrated in FIGS. 2C and 2D, the conductor layer 20 is formed on the surface 17 of at least a part of the insulator 10, thereby manufacturing the structure body 30. Typically, the conductor layer 20 can be formed by forming a seed layer by electroless plating, and then performing electrolytic plating. Specifically, palladium or the like as a catalyst for electroless plating is adsorbed on the surface 17 and the gap 13 existing between the resin 12 and the filler 14, and electroless plating is deposited with this catalyst as a starting point, so that the thin film 22 covering the plurality of fillers 14 is formed, and then a relatively thin first conductor layer 21 as illustrated in FIG. 2C is formed on the surface 17. Thereafter, electrolytic plating is performed using the electroless plating as the seed layer to form a relatively thick second conductor layer 23 as illustrated in FIG. 2D.

In the present specification, the first conductor layer 21 and the second conductor layer 23 in FIG. 2D are described separately for convenience, but for example, in a case where the conductor layer is formed only by electroless plating without performing electrolytic plating, or in a case where metals (for example, copper) to be deposited by electroless plating and electrolytic plating are the same, the structure body 30 in which the conductor layer 20 and the thin film 22 are formed of a single component as illustrated in FIG. 1 can be obtained. The electroless plating and the electrolytic plating may use different conductors.

<<<Other Optional Steps>>>

After the plating is performed, a heat treatment called annealing may be performed at about 80 to 200° C. for about 10 to 100 minutes for the purpose of stress removal and strength improvement of the metal.

<<<<Method of Using Structure Body>>>>

The structure body 30 according to the present embodiment can be used for, for example, a wiring board (for example, multilayer printed wiring board), a processed product subjected to decorative plating, and the like. Particularly, it is suitable for a wiring board for forming a high-definition circuit or forming a high frequency circuit. When a conductor circuit is formed from the conductor layer 20, patterning can be performed by a known method (for example, a subtractive method or a semi-additive method).

The present invention is not limited to the above-described embodiments, and various modifications such as design changes can be made on the basis of knowledge of those skilled in the art, and embodiments to which such modifications are made are also included in the scope of the present invention.

In the structure body 30 according to the present embodiment, another insulator layer can be further laminated on the opposite side of the interface 16 of the insulator 10. As the other insulator layer, a thermosetting composition different from the insulator 10, a photocurable composition, a cured product including a curable composition, a thermoplastic composition, and the like can be used. Examples of a lamination method include a method of forming the insulator 10 on the surface on which the other insulator layer is formed, a method of separately preparing the other insulator layer and the cured product 11 and press-bonding them to form the insulator 10, and a method of preparing a multilayer dry film including the curable composition of the present embodiment and the other curable composition. As described above, a layered structure in which another insulator layer is formed on the insulator 10 is also included in the scope of the present invention.

EXAMPLES

Hereinafter, the present invention will be described in more detail with reference to examples.

«Raw Materials»

As raw materials of the curable composition, the following materials were used.

<Resin (A)>

A-1: Polyphenylene ether resin 1 (Synthesis Example 1)
A-2: Polyphenylene ether resin 2 (Synthesis Example 2)
A-3: Polyphenylene ether resin 3 (Synthesis Example 3)
A-4: Polyphenylene ether resin 4 (Synthesis Example 4)

A-5: Noryl SA9000 (methacryl-modified linear polyphenylene ether manufactured by SABIC)

A-6: OPE-2St-1200 (styrene-modified linear polyphenylene ether manufactured by MITSUBISHI GAS CHEMICAL COMPANY, INC.)

A-7: N-740 (phenol novolac epoxy resin manufactured by DIC Corporation)

A-8: ZX-1059 (mixture of bisphenol A type epoxy resin and bisphenol F type epoxy resin manufactured by NIPPON STEEL Chemical & Materials Co., Ltd.)

A-9: NC-3000-H (biphenyl aralkyl epoxy resin manufactured by Nippon Kayaku Co., Ltd.)

A-10: JER828 (bisphenol A epoxy resin manufactured by Mitsubishi Chemical Corporation)

A-11: YX6954BH30 (phenoxy resin manufactured by Mitsubishi Chemical Corporation)

<Filler (B)>

B-1: YA050C-HHL (manufactured by ADMATECHS COMPANY LIMITED, spherical silica, average particle diameter: 0.05 μm, vinylsilane treatment, cyclohexanone slurry, and nonvolatile content: 40%)

B-2: Sciqas (manufactured by SAKAI CHEMICAL INDUSTRY CO., LTD., spherical silica, average particle diameter: 0.05 μm, phenylsilane treatment, and nonvolatile: 100%)

B-3: 3SV-CH3 (manufactured by ADMATECHS COMPANY LIMITED, spherical silica, average particle diameter: 0.3 μm, vinylsilane treatment, cyclohexanone slurry, and nonvolatile content: 60%)

B-4: 3SX-CH1 (manufactured by ADMATECHS COMPANY LIMITED, spherical silica, average particle diameter: 0.3 μm, phenylaminosilane treatment, cyclohexanone slurry, and nonvolatile content: 60%)

B-5: 3 SQ-CH1 (manufactured by ADMATECHS COMPANY LIMITED, spherical silica, average particle diameter: 0.3 μm, no surface treatment, cyclohexanone slurry, and nonvolatile content: 60%)

B-6: SC2050-HNF (manufactured by ADMATECHS COMPANY LIMITED, spherical silica, average particle diameter: 0.5 μm, vinylsilane treatment, cyclohexanone slurry, and nonvolatile content: 70%)

B-7: 5SP-CH1 (manufactured by ADMATECHS COMPANY LIMITED, spherical silica, average particle diameter: 0.5 μm, fuphenylsilane treatment, cyclohexanone slurry, and nonvolatile content: 70%)

B-8: 5SX-CH3 (manufactured by ADMATECHS COMPANY LIMITED, spherical silica, average particle diameter: 0.5 μm, fuphenylaminosilane treatment, cyclohexanone slurry, and nonvolatile content: 70%)

B-9: 5 SQ-CH1 (manufactured by ADMATECHS COMPANY LIMITED, spherical silica, average particle diameter: 0.5 μm, no surface treatment, cyclohexanone slurry, and nonvolatile content: 70%)

<Peroxide (C)>

C-1: Perbutyl (registered trademark) P40 (manufactured by NOF Corporation, α,α'-bis(t-butylperoxy-m-isopropyl)benzene)

<Crosslinkable Curing Agent (D)>

D-1: TAIC (registered trademark) (manufactured by Mitsubishi Chemical Corporation)

D-2: EPICLON (registered trademark) HPC-8000-65 T (manufactured by DIC Corporation)

D-3: LA-3018 (manufactured by DIC Corporation)

<Elastomer (E)>

E-1: Tuftec (registered trademark) H1051 (manufactured by Asahi Kasei Corp., hydrogenated styrene thermoplastic elastomer)

<Additive (F)>

F-1: BYK (registered trademark)-1791 (manufactured by Big Chemie Japan Co., Ltd., surfactant)

F-2: BYK (registered trademark)-352 (manufactured by Big Chemie Japan Co., Ltd., surfactant)

F-3: Polyflow No. 90 (manufactured by Kyoeisha Chemical Co., Ltd., surfactant)

F-4: DMAP (dimethylaminopyridine, curing catalyst)

F-5: KBM-403 (manufactured by Shin-Etsu Chemical Co., Ltd., dispersion aid)

<Solvent> cyclohexanone

«Manufacturing Method»

<Manufacture of Polyphenylene Ether Resin>

A polyphenylene ether resin was manufactured according to the method disclosed in WO 2020/017570 A. Specifically, the polyphenylene ether resin is manufactured as follows.

Synthesis Example 1

In a 3 L two-necked recovery flask, 2.6 g of di-μ-hydroxo-bis [(N,N,N',N'-tetramethylethylenediamine) Copper (II)] chloride (Cu/TMEDA) and 3.18 mL of tetramethylethylenediamine (TMEDA) were added and sufficiently dissolved, and oxygen was supplied at 10 ml/min. A raw material solution was prepared by dissolving 105 g of 2,6-dimethylphenol and 13 g of 2-allylphenol, which are raw material phenols, in 1.5 L of toluene. This raw material solution was added dropwise to a flask and was reacted at 40° C. for six hours while being stirred at a rotation speed of 600 rpm. After completion of the reaction, the mixture was reprecipitated with a mixed liquid of 20 L of methanol and 22 mL of concentrated hydrochloric acid, was taken out by filtration, and was dried at 80° C. for 24 hours to obtain a polyphenylene ether resin 1 containing a functional group having an unsaturated carbon bond and having a branching structure. The polyphenylene ether resin 1 had a number average molecular weight of 13,500 and a weight average molecular weight of 50,000.

Synthesis Example 2

In a 100 mL two-necked recovery flask, 2.34 g of 2,6-dimethylphenol, 0.342 g of 2-allylphenol, 0.382 g of 2-allyl-4,6-dimethylphenol, which are raw material phenols, and 17.7 g of toluene were added, stirred, and completely dissolved. 0.065 g of di-μ-hydroxo-bis [(N,N,N',N'-tetramethylethylenediamine) Copper (II)] chloride (Cu/TMEDA) and 0.076 g of tetramethylethylenediamine (TMEDA) were added to the prepared raw material solution, and dry air was supplied thereto at 10 ml/min. The mixture was reacted at 40° C. for 15 hours while being stirred at a rotation speed of 350 rpm. After completion of the reaction, the mixture was reprecipitated with a mixed liquid of 600 mL methanol: 5 mL ion-exchanged water: 1 mL concentrated hydrochloric acid, was taken out by filtration, and was dried at 80° C. for four hours to obtain a polyphenylene ether resin 2 containing a functional group having an unsaturated carbon bond and having a branching structure. The polyphenylene ether resin 2 had a number average molecular weight of 12,700 and a weight average molecular weight of 33,200.

Synthesis Example 3

In a 100 mL two-necked recovery flask, 7.44 g of 2,6-dimethylphenol, 0.930 g of 2-allylphenol, 1.03 g of 4-allyl-2,6-dimethylphenol, which are raw material phenols, and 52.39 g of toluene were added, stirred, and completely dissolved. 0.206 g of di-μ-hydroxo-bis [(N,N,N',N'-tetramethylethylenediamine) Copper (II)] chloride (Cu/TMEDA) and 0.195 g of tetramethylethylenediamine (TMEDA) were added to the prepared raw material solution, and dry air was supplied thereto at 30 ml/min. The mixture was reacted at 40° C. for 23 hours while being stirred at a rotation speed of 350 rpm. After completion of the reaction, the mixture was reprecipitated with a mixed liquid of 500 mL methanol: 10 mL ion-exchanged water: 1 mL concentrated hydrochloric acid, and was taken out by filtration, and was dried at 80° C. for four hours to obtain a polyphenylene ether resin 3 containing a functional group having an unsaturated carbon bond and having a branching structure. The polyphenylene ether resin 3 had a number average molecular weight of 14,600 and a weight average molecular weight of 92,900.

Synthesis Example 4

In a 100 mL two-necked recovery flask, 3.61 g of 2,6-dimethylphenol, 0.507 g of 2-allylphenol, 0.882 g of 2,6-dimethyl-4-(4-vinylbenzyl) phenol, which are raw material phenols, and 28.91 g of toluene were added, stirred, and completely dissolved. 0.119 g of di-μ-hydroxo-bis [(N,N,N',N'-tetramethylethylenediamine) Copper (II)] chloride (Cu/TMEDA) and 0.131 g of tetramethylethylenediamine (TMEDA) were added to the prepared raw material solution, and dry air was supplied thereto at 17 ml/min. The mixture was reacted at 40° C. for 15 hours while being stirred at a rotation speed of 350 rpm. After completion of the reaction, the mixture was reprecipitated with a mixed liquid of 500 mL methanol: 5 mL ion-exchanged water: 1 mL concentrated hydrochloric acid, and was taken out by filtration, and was dried at 80° C. for three hours to obtain a polyphenylene ether resin 4 containing a functional group having an unsaturated carbon bond and having a branching structure. The polyphenylene ether resin 4 had a number average molecular weight of 12,700 and a weight average molecular weight of 45,300.

<Preparation of Curable Composition>

The curable compositions of the examples and the Comparative Examples were prepared by blending the above-described raw materials in blending amounts shown in Table 1-1, Table 1-2, and Table 2, and sufficiently stirring and mixing the mixture using a rotation/revolution mixer. The blending amounts shown in Table 1-1, Table 1-2, and Table 2 indicate amounts based on the components (solid content) excluding volatile components.

<Curing Step>

Each curable composition was applied onto a PET film with an applicator so as to have a theoretical film thickness of 40 μm after curing, and was dried in a drying furnace at 90° C. for 10 minutes to prepare a dry film including a resin layer derived from each curable composition. Then, each dry film was laminated on a copper-clad laminate with a vacuum laminator at 100° C. and 0.5 MPa, the PET film was peeled off, and then heating was performed in an inert gas oven at 200° C. for 60 minutes to prepare a test substrate having a cured product derived from each curable composition.

<Gap Formation Step>

A gap formation treatment was performed on the surface of the cured product of each test substrate using the following commercially available gap formation treatment liquid, thereby obtaining an insulator according to the present embodiment. Specifically, the treatment was performed at a liquid temperature and an immersion time described in Table 1-1, Table 1-2, and Table 2 using a swelling dip secure ligand P (manufactured by Atotech Japan Co., Ltd.) as an alkali treatment liquid, a concentrate compact CP (manufactured by Atotech Japan Co., Ltd.) as an oxidation treatment liquid, and a reduction secure ligand P500 (manufactured by Atotech Japan Co., Ltd.) as an acid treatment liquid.

<Conductor Layer Formation Step>

An electroless plating treatment and an electrolytic plating treatment were performed on each insulator to form a conductor layer, thereby obtaining a structure body. Specifically, as the electroless plating treatment, electroless copper plating was performed by immersion in a cleaner treatment liquid (Cleaner MCD-PL, manufactured by C. Uyemura & Co., Ltd.) at 40° C. for five minutes, immersion in a soft etching treatment liquid (Alcup (registered trademark) Predip MDP-2, manufactured by C. Uyemura & Co., Ltd.) at 25° C. for two minutes, immersion in a catalyst applying treatment liquid (Alcup (registered trademark) MAT-SP, manufactured by C. Uyemura & Co., Ltd.) at 40° C. for five minutes, immersion in a reduction treatment liquid (Alcup (registered trademark) reducer MRD-2-C/MAB-4-C/MAB-4-A, manufactured by C. Uyemura & Co., Ltd.) at 35° C. for three minutes, immersion in a reactivity promoting treatment liquid (Alcup (registered trademark) accelerator MEL-3-A, manufactured by C. Uyemura & Co., Ltd.) at 25° C. for one minute, and immersion in an electroless plating treatment liquid (Sulcup (registered trademark) PEA V2 manufactured by C. Uyemura & Co., Ltd.) at 36° C. for 20 minutes. Thereafter, as the electrolytic plating treatment, each insulator was immersed in acid washing (Acidic cleaner manufactured by Atotech Japan Co., Ltd.) at 46° C. for five minutes, was immersed in a 10% sulfuric acid aqueous solution at 25° C. for one minute, and was immersed in a copper sulfate plating liquid at 25° C. for 60 minutes. Thereafter, the electrolytic copper plating was performed thereon under the condition of a current density of 2 A/2 dm. Finally, as annealing, heat treatment was performed at 190° C. for 60 minutes in a hot air circulating drying furnace.

«Evaluation»

The following evaluations were performed for each of the examples and the Comparative Examples. The results are shown in Table 1-1, Table 1-2, and Table 2. It is noted that the Examples 3 and 10 in Table 2 are shown again in Table 1-1 and Table 1-2. Details of each evaluation method will be described below.

<Depth from Interface>

Figure 3:
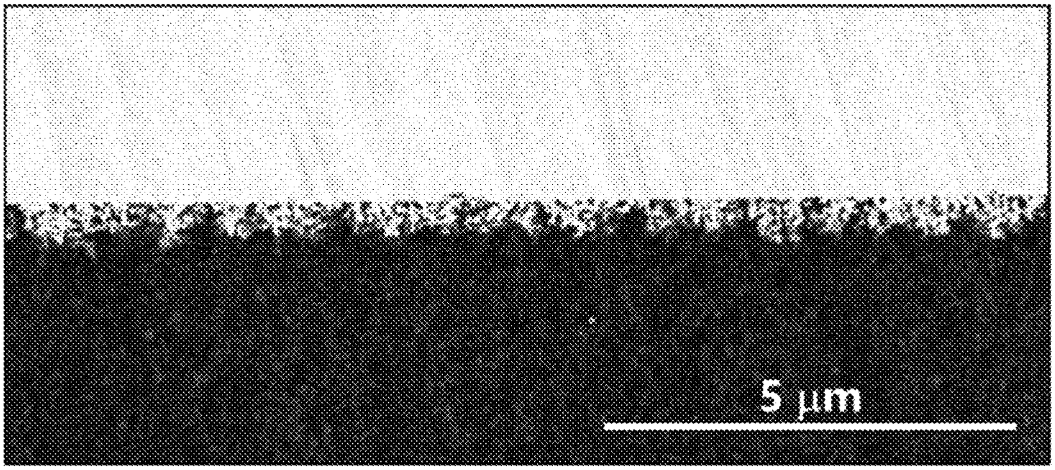
FIG. 3 is an enlarged image of a cross-sectional photograph of a structure body according to an Example 3.
Figure 4:
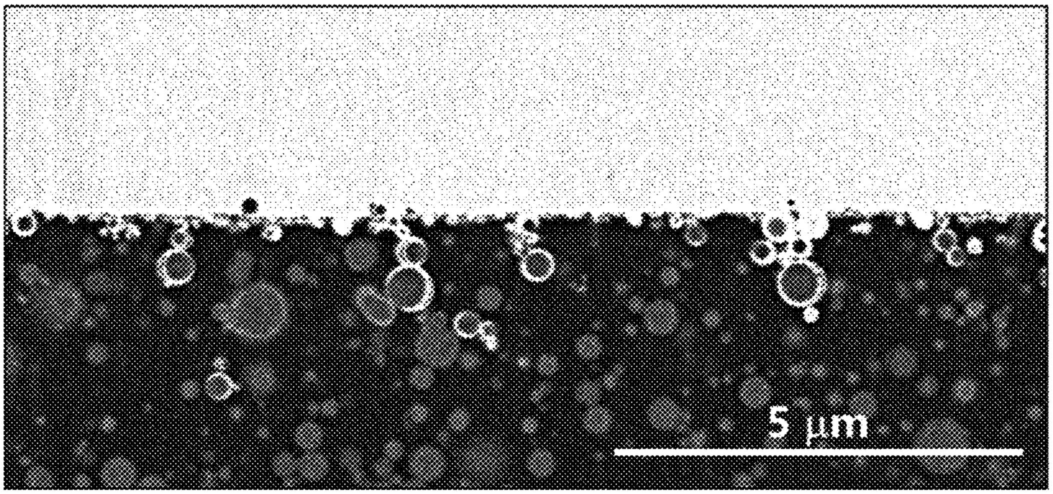
FIG. 4 is an enlarged image of a cross-sectional photograph of a structure body according to an Example 6.
Figure 5:
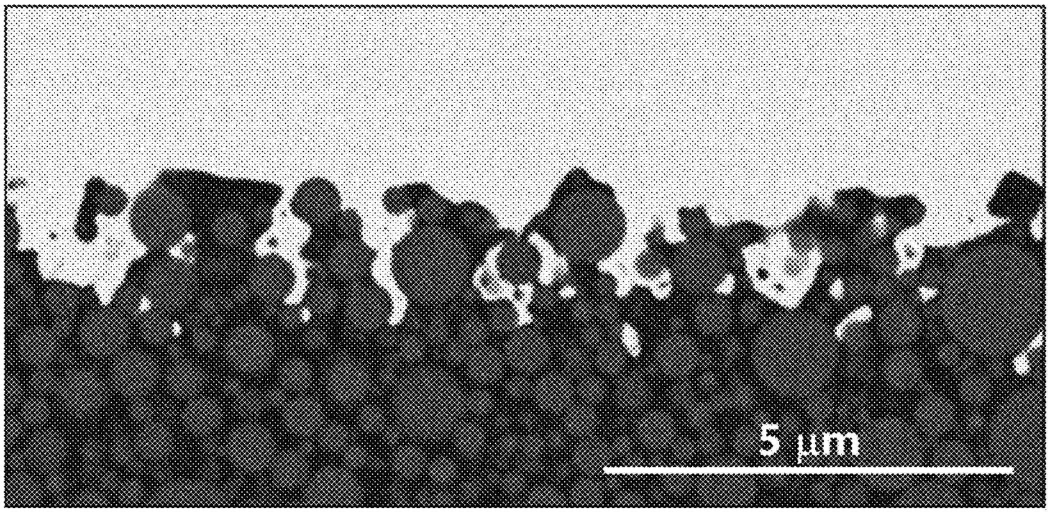
FIG. 5 is an enlarged image of a cross-sectional photograph of a structure body according to a second comparative embodiment.

For each structure body (cross section), using a Schottky scanning electron microscope (manufactured by Hitachi High-Tech Corporation), images of Examples 1 to 5, Examples 13 to 17, and a Comparative Example 3 were taken at a magnification of 10,000 to 50,000, images of Examples 6 to 8 were taken at a magnification of 5,000 to 10,000, images of Examples 9 to 12, Examples 18 to 22, and Comparative Examples 2 and 4 were taken at a magnification of 5,000 to 10,000, and the longest depth of a conductor layer component entering between a filler and a resin of an insulator was measured at five points in the vertical direction from an interface where the insulator and the conductor layer were in contact with each other toward the insulator, and an average value was calculated. FIG. 3 is a view showing an enlarged image of a cross-sectional photograph of a structure body according to the Example 3, FIG. 4 is a view showing an enlarged image of a cross-sectional photograph of a structure body according to the Example 6, and FIG. 5 is a view showing an enlarged image of a cross-sectional photograph of a structure body according to the Comparative Example 2. In each enlarged image, a portion appearing white indicates the conductor layer and its components, a portion appearing gray indicates the filler (silica), and a portion appearing black indicates the resin. As described above, in the example, the component forming the conductor layer entered between some of the fillers and the resin, and was connected to the conductor layer.

It is noted that it was confirmed whether a gap was formed between the filler and the resin in each of the examples and the Comparative Examples. The confirmation results are shown in Table 1-1, Table 1-2, and Table 2. A case in which a gap was formed was referred to as "presence", and a case in which no gap was formed was referred to as "absence".

<Plating Swelling>

For each structure body, the state of the copper plated layer (conductor layer) of each sample was observed to evaluate plating swelling. The determination criteria are described as follows.

Absence: no bulging or peeling in copper plated layer (conductor layer)

Presence: swelling or peeling is observed in the copper plated layer (conductor layer).

<Surface Roughness Ra>

For each insulator before the conductor layer formation step, arithmetic average surface roughness was measured at any 10 points on the surface on which the conductor layer was formed, using a white interference microscope (Bruker Contour GT-I manufactured by Bruker Japan Ltd., measurement range 0.17 mm×0.13 mm) corresponding to a non-contact measurement method. The average value of the respective measured values was taken as the surface roughness Ra of the insulator. In addition, in the Examples 3, 10, and 13 to 22, and the Comparative Examples 3 and 4, the surface roughness Ra was also measured similarly for each insulator after each structure body was immersed in a ferric chloride solution at 25° C. until the conductor layer was completely removed therefrom.

<Peel Strength>

Peel strength of each structure body was evaluated. Specifically, first, a cut having a width of 10 mm and a length of 60 mm was made in the conductor layer of each sample. One end in the longitudinal direction of the conductor layer in a region where the cut was made was peeled off, a peeled portion was sandwiched with a gripper, the copper plating layer (conductor layer) was peeled off at a speed of 50 mm/min by a length of 35 mm at an angle of 90 degrees using a tabletop tensile tester (EZ-SX manufactured by SHIMADZU CORPORATION), and peel strength (N/cm) was measured. It is noted that, in the Comparative Example 1, since plating swelling occurred after the annealing step, the peel strength could not be measured.

TABLE 1-1

| Blending component (parts by mass of nonvolatile content) | | | Example 1 | Example 2 | Example 3 | Example 4 | Example 5 |
|---|---|---|---|---|---|---|---|
| Resin | Polyphenylene ether resin | A-1 | 100.0 | 100.0 | 100.0 | 100.0 | 100.0 |
| | | A-2 | | | | | |
| | | A-3 | | | | | |
| | | A-4 | | | | | |
| | | A-5 | | | | | |
| | | A-6 | | | | | |
| | Epoxy resin | A-7 N740 | | | | | |
| | | A-8 ZX1059 | | | | | |
| | | A-9 NC3000H | | | | | |
| | | A-10 JER828 | | | | | |
| | Phenoxy resin | A-11 YX6954 | | | | | |
| Filler | Average particle diameter = 0.05 μm D90 = 0.1 um | B-1 | 23.6 | 53.2 | 91.6 | 142.0 | |
| | | B-2 | | | | | 91.6 |
| | Average particle diameter = 0.3 μm D90 = 0.6 um | B-3 | | | | | |
| | | B-4 | | | | | |
| | | B-5 | | | | | |
| | Average particle diameter = 0.5 μm D90 = 0.8 um | B-6 | | | | | |
| | | B-7 | | | | | |
| | | B-8 | | | | | |
| | | B-9 | | | | | |
| Peroxide | | C-1 | 3.3 | 3.3 | 3.3 | 3.3 | 3.3 |
| Crosslinkable curing agent | | D-1 | 59.7 | 59.7 | 59.7 | 59.7 | 59.7 |
| | | D-2 HPC8000 | | | | | |
| | | D-3 LA-3018 | | | | | |
| Elastomer | | E-1 | 49.0 | 49.0 | 49.0 | 49.0 | 49.0 |
| Additive | Surfactant | F-1 1791 | 0.4 | 0.4 | 0.4 | 0.4 | 0.4 |
| | | F-2 352 | 0.2 | 0.2 | 0.2 | 0.2 | 0.2 |
| | | F-3 90 | 0.1 | 0.1 | 0.1 | 0.1 | 0.1 |
| | Curing catalyst | F-4 DMAP | | | | | |
| | Dispersion aid | F-5 403 | | | | | |
| Total | | | 236.3 | 265.9 | 304.3 | 354.7 | 304.3 |
| Filler blending amount [% by vol] | | | 5.1 | 10.7 | 17.1 | 24.2 | 17.1 |
| Gap formation treatment immersion time | Alkali treatment liquid (60° C.) [min] | | 5 | 5 | 5 | 5 | 5 |
| | Oxidation treatment liquid (80° C.) [min] | | 20 | 20 | 20 | 20 | 20 |
| | Acid treatment liquid (40° C.) [min] | | 5 | 5 | 5 | 5 | 5 |
| Evaluation items | Gap formation | | Presence | Presence | Presence | Presence | Presence |
| | Depth of conductor layer (from surface) [μm] | | 0.15 | 0.25 | 0.50 | 0.70 | 0.50 |
| | Depth of conductor layer/filler average particle diameter | | 3 | 5 | 10 | 14 | 10 |
| | Plating swelling after annealing | | Absence | Absence | Absence | Absence | Absence |
| | Surface roughness Ra [nm] | | 52 | 60 | 56 | 56 | 60 |
| | Peel strength [N/cm] | | 5.6 | 6.5 | 7.6 | 5.5 | 5.5 |

TABLE 1-1-continued

| Blending component (parts by mass of nonvolatile content) | | | Example 6 | Example 7 | Example 8 | Example 9 |
|---|---|---|---|---|---|---|
| Resin | Polyphenylene ether resin | A-1 | 100.0 | 100.0 | 100.0 | 100.0 |
| | | A-2 | | | | |
| | | A-3 | | | | |
| | | A-4 | | | | |
| | | A-5 | | | | |
| | | A-6 | | | | |
| | Epoxy resin | A-7 N740 | | | | |
| | | A-8 ZX1059 | | | | |
| | | A-9 NC3000H | | | | |
| | | A-10 JER828 | | | | |
| | Phenoxy resin | A-11 YX6954 | | | | |
| Filler | Average particle diameter = 0.05 μm D90 = 0.1 um | B-1 | | | | |
| | | B-2 | | | | |
| | Average particle diameter = 0.3 μm D90 = 0.6 um | B-3 | 91.6 | | | |
| | | B-4 | | 91.6 | | |
| | | B-5 | | | 91.6 | |
| | Average particle diameter = 0.5 μm D90 = 0.8 um | B-6 | | | | 91.6 |
| | | B-7 | | | | |
| | | B-8 | | | | |
| | | B-9 | | | | |
| Peroxide | | C-1 | 3.3 | 3.3 | 3.3 | 3.3 |
| Crosslinkable curing agent | | D-1 | 59.7 | 59.7 | 59.7 | 59.7 |
| | | D-2 HPC8000 | | | | |
| | | D-3 LA-3018 | | | | |
| Elastomer | | E-1 | 49.0 | 49.0 | 49.0 | 49.0 |
| Additive | Surfactant | F-1 1791 | 0.4 | 0.4 | 0.4 | 0.4 |
| | | F-2 352 | 0.2 | 0.2 | 0.2 | 0.2 |
| | | F-3 90 | 0.1 | 0.1 | 0.1 | 0.1 |
| | Curing catalyst | F-4 DMAP | | | | |
| | Dispersion aid | F-5 403 | | | | |
| Total | | | 304.3 | 304.3 | 304.3 | 304.3 |
| Filler blending amount [% by vol] | | | 17.1 | 17.1 | 17.1 | 17.1 |
| Gap formation treatment immersion time | Alkali treatment liquid (60° C.) [min] | | 5 | 5 | 5 | 5 |
| | Oxidation treatment liquid (80° C.) [min] | | 20 | 20 | 20 | 20 |
| | Acid treatment liquid (40° C.) [min] | | 5 | 5 | 5 | 5 |
| Evaluation items | Gap formation | | Presence | Presence | Presence | Presence |
| | Depth of conductor layer (from surface) [μm] | | 2.8 | 2.5 | 2.7 | 3.1 |
| | Depth of conductor layer/filler average particle diameter | | 9 | 8 | 9 | 6 |
| | Plating swelling after annealing | | Absence | Absence | Absence | Absence |
| | Surface roughness Ra [nm] | | 59 | 62 | 62 | 57 |
| | Peel strength [N/cm] | | 8.2 | 9.3 | 8 | 8.7 |

TABLE 1-2

| Blending component (parts by mass of nonvolatile content) | | | Example 10 | Example 11 | Example 12 | Example 13 | Example 14 | Example 15 |
|---|---|---|---|---|---|---|---|---|
| Resin | Polyphenylene ether resin | A-1 | | | | | | 100.0 |
| | | A-2 | 100.0 | | | | | |
| | | A-3 | | 100.0 | | | | |
| | | A-4 | | | 100.0 | | | |
| | | A-5 | | | | 100.0 | | |
| | | A-6 | | | | | 100.0 | |
| | Epoxy resin | A-7 N740 | | | | | | |
| | | A-8 ZX1059 | | | | | | |
| | | A-9 NC3000H | | | | | | |
| | | A-10 JER828 | | | | | | |
| | Phenoxy resin | A-11 YX6954 | | | | | | |
| Filler | Average particle diameter = 0.05 μm D90 = 0.1 um | B-1 | | | | | | |
| | | B-2 | | | | | | |
| | Average particle diameter = 0.3 μm D90 = 0.6 um | B-3 | | | | | | |
| | | B-4 | | | | | | |
| | | B-5 | | | | | | |
| | Average particle diameter = 0.5 μm D90 = 0.8 um | B-6 | 91.6 | 91.6 | 91.6 | 142.0 | 142.0 | |
| | | B-7 | | | | | | 91.6 |
| | | B-8 | | | | | | |
| | | B-9 | | | | | | |
| Peroxide | | C-1 | 3.3 | 3.3 | 3.3 | 3.3 | 3.3 | 3.3 |
| Crosslinkable curing agent | | D-1 | 59.7 | 59.7 | 59.7 | 59.7 | 59.7 | 59.7 |
| | | D-2 HPC8000 | | | | | | |
| | | D-3 LA-3018 | | | | | | |

TABLE 1-2-continued

| | | | | | | | | |
|---|---|---|---|---|---|---|---|---|
| Elastomer | | E-1 | 49.0 | 49.0 | 49.0 | 49.0 | 49.0 | 49.0 |
| Additive | Surfactant | F-1 1791 | 0.4 | 0.4 | 0.4 | 0.4 | 0.4 | 0.4 |
| | | F-2 352 | 0.2 | 0.2 | 0.2 | 0.2 | 0.2 | 0.2 |
| | | F-3 90 | 0.1 | 0.1 | 0.1 | 0.1 | 0.1 | 0.1 |
| | Curing catalyst | F-4 DMAP | | | | | | |
| | Dispersion aid | F-5 403 | | | | | | |
| Total | | | 304.3 | 304.3 | 304.3 | 354.7 | 354.7 | 304.3 |
| Filler blending amount [% by vol] | | | 17.1 | 17.1 | 17.1 | 24.2 | 24.2 | 17.1 |
| Gap formation treatment immersion time | Alkali treatment liquid (60° C.) [min] | | 5 | 5 | 5 | 5 | 5 | 5 |
| | Oxidation treatment liquid (80° C.) [min] | | 20 | 20 | 20 | 20 | 20 | 20 |
| | Acid treatment liquid (40° C.) [min] | | 5 | 5 | 5 | 5 | 5 | 5 |
| Evaluation items | Gap formation | | Presence | Presence | Presence | Presence | Presence | Presence |
| | Depth of conductor layer (from surface) [μm] | | 4.0 | 3.0 | 5.0 | 0.5 | 0.8 | 3.0 |
| | Depth of conductor layer/filler average particle diameter | | 8 | 6 | 10 | 1 | 2 | 6 |
| | Plating swelling after annealing | | Absence | Absence | Absence | Absence | Absence | Absence |
| | Surface roughness Ra [nm] | | 99 | 93 | 61 | 65 | 64 | 59 |
| | Peel strength [N/cm] | | 5 | 8 | 5.6 | 5 | 5 | 7.5 |

| Blending component (parts by mass of nonvolatile content) | | | Example 16 | Example 17 | Example 18 | Comparative Example 1 | Comparative Example 2 |
|---|---|---|---|---|---|---|---|
| Resin | Polyphenylene ether resin | A-1 | 100.0 | 100.0 | | 100.0 | |
| | | A-2 | | | | | |
| | | A-3 | | | | | |
| | | A-4 | | | | | |
| | | A-5 | | | | | |
| | | A-6 | | | | | |
| | Epoxy resin | A-7 N740 | | | | | 6.7 |
| | | A-8 ZX1059 | | | 6.8 | | 41.7 |
| | | A-9 NC3000H | | | 50.1 | | 41.7 |
| | | A-10 JER828 | | | 36.9 | | |
| | Phenoxy resin | A-11 YX6954 | | | 6.2 | | 10.0 |
| Filler | Average particle diameter = 0.05 μm D90 = 0.1 um | B-1 | | | | | |
| | | B-2 | | | | | |
| | Average particle diameter = 0.3 μm D90 = 0.6 um | B-3 | | | | | |
| | | B-4 | | | | | |
| | | B-5 | | | | | |
| | Average particle diameter = 0.5 μm D90 = 0.8 um | B-6 | | | | | |
| | | B-7 | | | | | |
| | | B-8 | 91.6 | | 93.7 | | 541.7 |
| | | B-9 | | 91.6 | | | |
| Peroxide | | C-1 | 3.3 | 3.3 | | 3.3 | |
| Crosslinkable curing agent | | D-1 | 59.7 | 59.7 | | 59.7 | |
| | | D-2 HPC8000 | | | 28.9 | | 83.3 |
| | | D-3 LA-3018 | | | 6.7 | | 8.3 |
| Elastomer | | E-1 | 49.0 | 49.0 | | 49.0 | |
| Additive | Surfactant | F-1 1791 | 0.4 | 0.4 | 0.2 | 0.4 | 0.2 |
| | | F-2 352 | 0.2 | 0.2 | 0.1 | 0.2 | 0.1 |
| | | F-3 90 | 0.1 | 0.1 | 0.1 | 0.1 | 0.1 |
| | Curing catalyst | F-4 DMAP | | | 0.1 | | 0.3 |
| | Dispersion aid | F-5 403 | | | 1.5 | | 1.4 |
| Total | | | 304.3 | 304.3 | 231.4 | 212.7 | 735.4 |
| Filler blending amount [% by vol] | | | 17.1 | 17.1 | 24.2 | 0.0 | 60.2 |
| Gap formation treatment immersion time | Alkali treatment liquid (60° C.) [min] | | 5 | 5 | 5 | 5 | 5 |
| | Oxidation treatment liquid (80° C.) [min] | | 20 | 20 | 20 | 20 | 20 |
| | Acid treatment liquid (40° C.) [min] | | 5 | 5 | 5 | 5 | 5 |
| Evaluation items | Gap formation | | Presence | Presence | Presence | Absence | Absence |
| | Depth of conductor layer (from surface) [μm] | | 3.0 | 3.2 | 1.0 | 0 | 2 |
| | Depth of conductor layer/filler average particle diameter | | 6 | 6 | 2 | 0 | 4 |
| | Plating swelling after annealing | | Absence | Absence | Absence | Presence | Presence |
| | Surface roughness Ra [nm] | | 61 | 60 | 27 | 38 | 147 |
| | Peel strength [N/cm] | | 8.8 | 7.9 | 5.8 | — | 3.5 |

TABLE 2

| Blending component (parts by mass of nonvolatile content) | | | | Comparative Example 3 | Example 13 | Example 14 | Example 15 | Example 3 | Example 16 | Example 17 |
|---|---|---|---|---|---|---|---|---|---|---|
| Resin | Polyphenylene ether resin | | A-1 | 100.0 | 100.0 | 100.0 | 100.0 | 100.0 | 100.0 | 100.0 |
| Filler | Average particle diameter = 0.05 µm D90 = 0.1 um | | B-1 | 91.6 | 91.6 | 91.6 | 91.6 | 91.6 | 91.6 | 91.6 |
| | Average particle diameter = 0.5 µm D90 = 0.8 um | | B-7 | | | | | | | |
| Peroxide | | | C-1 | 3.3 | 3.3 | 3.3 | 3.3 | 3.3 | 3.3 | 3.3 |
| Crosslinkable curing agent | | | D-1 | 59.7 | 59.7 | 59.7 | 59.7 | 59.7 | 59.7 | 59.7 |
| Elastomer | | | E-1 | 49.0 | 49.0 | 49.0 | 49.0 | 49.0 | 49.0 | 49.0 |
| Additive | Surfactant | | F-1 | 0.4 | 0.4 | 0.4 | 0.4 | 0.4 | 0.4 | 0.4 |
| | | | F-2 | 0.2 | 0.2 | 0.2 | 0.2 | 0.2 | 0.2 | 0.2 |
| | | | F-3 | 0.1 | 0.1 | 0.1 | 0.1 | 0.1 | 0.1 | 0.1 |
| Total | | | | 304.3 | 304.3 | 304.3 | 304.3 | 304.3 | 304.3 | 304.3 |
| Filler blending amount [% by vol] | | | | 17.1 | 17.1 | 17.1 | 17.1 | 17.1 | 17.1 | 17.1 |
| Gap formation treatment immersion time | Alkali treatment liquid (60° C.) [min] | | | 0 | 0 | 5 | 5 | 5 | 10 | 10 |
| | Oxidation treatment liquid (80° C.) [min] | | | 0 | 10 | 5 | 10 | 20 | 10 | 20 |
| | Acid treatment liquid (40° C.) [min] | | | 0 | 5 | 5 | 5 | 5 | 5 | 5 |
| Evaluation items | Gap formation | | | Absence | Presence | Presence | Presence | Presence | Presence | Presence |
| | Depth of conductor layer (from surface) [µm] | | | 0.05 | 0.14 | 0.17 | 0.31 | 0.50 | 0.45 | 0.60 |
| | Depth of conductor layer/filler average particle diameter | | | 1.0 | 2.7 | 3.4 | 6.2 | 10.0 | 9.0 | 12.0 |
| | Plating swelling after annealing | | | Absence | Absence | Absence | Absence | Absence | Absence | Absence |
| | Surface roughness | Surface roughness Ra [nm] | | 35 | 33 | 48 | 43 | 56 | 45 | 59 |
| | Ra [nm] | Peel strength [N/cm] | | 40 | 42 | 45 | 51 | 53 | 44 | 60 |
| | Peel strength [N/cm] | | | 2.5 | 5.1 | 6.1 | 5.3 | 7.6 | 6.0 | 7.6 |

| Blending component (parts by mass of nonvolatile content) | | | | Example 4 | Example 18 | Example 19 | Example 20 | Example 10 | Example 21 | Example 22 |
|---|---|---|---|---|---|---|---|---|---|---|
| Resin | Polyphenylene ether resin | | A-1 | 100.0 | 100.0 | 100.0 | 100.0 | 100.0 | 100.0 | 100.0 |
| Filler | Average particle diameter = 0.05 µm D90 = 0.1 um | | B-1 | | | | | | | |
| | Average particle diameter = 0.5 µm D90 = 0.8 um | | B-7 | 91.6 | 91.6 | 91.6 | 91.6 | 91.6 | 91.6 | 91.6 |
| Peroxide | | | C-1 | 3.3 | 3.3 | 3.3 | 3.3 | 3.3 | 3.3 | 3.3 |
| Crosslinkable curing agent | | | D-1 | 59.7 | 59.7 | 59.7 | 59.7 | 59.7 | 59.7 | 59.7 |
| Elastomer | | | E-1 | 49.0 | 49.0 | 49.0 | 49.0 | 49.0 | 49.0 | 49.0 |
| Additive | Surfactant | | F-1 | 0.4 | 0.4 | 0.4 | 0.4 | 0.4 | 0.4 | 0.4 |
| | | | F-2 | 0.2 | 0.2 | 0.2 | 0.2 | 0.2 | 0.2 | 0.2 |
| | | | F-3 | 0.1 | 0.1 | 0.1 | 0.1 | 0.1 | 0.1 | 0.1 |
| Total | | | | 304.3 | 304.3 | 304.3 | 304.3 | 304.3 | 304.3 | 304.3 |
| Filler blending amount [% by vol] | | | | 17.1 | 17.1 | 17.1 | 17.1 | 17.1 | 17.1 | 17.1 |
| Gap formation treatment immersion time | Alkali treatment liquid (60° C.) [min] | | | 0 | 0 | 5 | 5 | 5 | 10 | 10 |
| | Oxidation treatment liquid (80° C.) [min] | | | 0 | 10 | 5 | 10 | 20 | 10 | 20 |
| | Acid treatment liquid (40° C.) [min] | | | 0 | 5 | 5 | 5 | 5 | 5 | 5 |
| Evaluation items | Gap formation | | | Absence | Presence | Presence | Presence | Presence | Presence | Presence |
| | Depth of conductor layer (from surface) [µm] | | | 0.05 | 0.91 | 1.2 | 2.2 | 3.0 | 2.7 | 4.9 |
| | Depth of conductor layer/filler average particle diameter | | | 0.1 | 1.8 | 2.4 | 4.4 | 6.0 | 5.4 | 9.8 |
| | Plating swelling after annealing | | | Absence | Absence | Absence | Absence | Absence | Absence | Absence |
| | Surface roughness | Surface roughness Ra [nm] | | 35 | 43 | 53 | 55 | 40 | 50 | 51 |
| | Ra [nm] | Peel strength [N/cm] | | 42 | 37 | 53 | 63 | 57 | 38 | 50 |
| | Peel strength [N/cm] | | | 2.2 | 4.8 | 6.0 | 6.7 | 8.7 | 6.6 | 8.7 |

REFERENCE SIGNS LIST

10 Insulator
11 Cured product
12 RESIN
13 Gap
14 Filler
16 Interface
17 Surface
20 Conductor layer
21 First conductor layer
22 Thin film
23 Second conductor layer
30 Structure body

The invention claimed is:

1. A structure body, comprising:
an insulator; and
a conductor layer on a surface of at least a portion of the insulator,
wherein the insulator comprises a resin and a plurality of fillers, and at least one conductor layer component of the conductor layer is present between at least one of the plurality of fillers and the resin from an interface between the insulator and the conductor layer, and is connected to the conductor layer, and
wherein a thin film covering the plurality of the fillers is formed by the at least conductor layer component present between the fillers and the resin.

2. The structure body according to claim 1, wherein each filler of the plurality of the fillers has an average particle diameter of 1.0 μm or less.

3. The structure body according to claim 1, wherein a depth of the conductor layer component entering between the plurality of the fillers and the resin from the interface is from 1.5 times to 22 times an average particle diameter of the filler.

4. The structure body according to claim 1, wherein the filler is a metal oxide.

5. The structure body according to claim 1, wherein the at least one conductor layer component is a metal component.

6. A wiring board comprising the structure body according to claim 1.

7. The structure body according to claim 1, wherein the resin is a hydrophobic resin.

8. The structure body according to claim 1, wherein the resin comprises a polyphenylene ether resin or an epoxy resin.

9. The structure body according to claim 1, wherein the resin does not comprise an elastomer.

10. The structure body according to claim 1, wherein the filler is selected from the group consisting of an inorganic filler, a metal oxide, a metal hydroxide, a filler having a perovskite-type crystal structure, and a combination thereof.

11. A structure body, comprising:
an insulator; and
a conductor layer on a surface of at least a portion of the insulator,
wherein the insulator comprises a resin and a plurality of fillers, and at least one conductor layer component of the conductor layer is present between at least one of the plurality of fillers and the resin from an interface between the insulator and the conductor layer, and is connected to the conductor layer, and
wherein a depth of the conductor layer component entering between the filler and the resin from the interface is from 1.5 times to 22 times an average particle diameter of the filler.

12. The structure body according to claim 11, wherein each filler of the plurality of the fillers has an average particle diameter of 1.0 μm or less.

13. The structure body according to claim 11, wherein the filler is a metal oxide.

14. The structure body according to claim 11, wherein the at least one conductor layer component is a metal component.

15. A wiring board comprising the structure body according to claim 11.

16. The structure body according to claim 11, wherein the resin is a hydrophobic resin.

17. The structure body according to claim 11, wherein the resin comprises a polyphenylene ether resin or an epoxy resin.

18. The structure body according to claim 11, wherein the resin does not comprise an elastomer.

19. The structure body according to claim 11, wherein the filler is selected from the group consisting of an inorganic filler, a metal oxide, a metal hydroxide, a filler having a perovskite-type crystal structure, and a combination thereof.

20. The structure body according to claim 11, wherein a thin film covering the plurality of the fillers is formed by the at least conductor layer component present between the fillers and the resin.

* * * * *